United States Patent
Ding et al.

(10) Patent No.: US 10,991,735 B2
(45) Date of Patent: Apr. 27, 2021

(54) OPTICAL DETECTION PIXEL UNIT, OPTICAL DETECTION CIRCUIT, OPTICAL DETECTION METHOD AND DISPLAY DEVICE

(71) Applicant: BOE TECHNOLOGY GROUP CO., LTD., Beijing (CN)

(72) Inventors: Xiaoliang Ding, Beijing (CN); Xue Dong, Beijing (CN); Haisheng Wang, Beijing (CN); Yingming Liu, Beijing (CN); Chihjen Cheng, Beijing (CN); Pengpeng Wang, Beijing (CN); Yanling Han, Beijing (CN); Wei Liu, Beijing (CN)

(73) Assignee: BOE TECHNOLOGY GROUP CO., LTD., Beijing (CN)

( * ) Notice: Subject to any disclaimer, the term of this patent is extended or adjusted under 35 U.S.C. 154(b) by 0 days.

(21) Appl. No.: 16/454,281

(22) Filed: Jun. 27, 2019

(65) Prior Publication Data
US 2020/0029048 A1 Jan. 23, 2020

(30) Foreign Application Priority Data
Jul. 17, 2018 (CN) .......................... 201810782411.9

(51) Int. Cl.
*H01L 27/146* (2006.01)
*H04N 5/378* (2011.01)
(Continued)

(52) U.S. Cl.
CPC ...... *H01L 27/14612* (2013.01); *H01L 27/146* (2013.01); *H04N 5/374* (2013.01);
(Continued)

(58) Field of Classification Search
None
See application file for complete search history.

(56) References Cited

U.S. PATENT DOCUMENTS 6,043,479 A * 3/2000 Chiang ............ H01L 27/14609
250/208.1
2005/0116902 A1 6/2005 Miyzawa
(Continued)

FOREIGN PATENT DOCUMENTS

| CN | 103259983 A | 8/2013 |
| CN | 107426513 A | 12/2017 |

(Continued)

OTHER PUBLICATIONS

1$^{st}$ Chinese Office Action, English Translation.
(Continued)

*Primary Examiner* — Twyler L Haskins
*Assistant Examiner* — Wesley J Chiu
(74) *Attorney, Agent, or Firm* — Brooks Kushman P.C.

(57) ABSTRACT

The present disclosure provides an optical detection pixel unit, an optical detection pixel circuit, an optical detection method and a display device. The optical detection pixel unit comprise a photosensitive element and a detection transistor, wherein the photosensitive element has a first electrode connected with a photovoltage terminal, and a second electrode connected with a gate of the detection transistor; the photosensitive element is configured to detect an optical signal under the control of the photovoltage terminal; and the detection transistor has a first electrode connected with a detection voltage line, and a second electrode connected with a reading line.

12 Claims, 5 Drawing Sheets

(51) Int. Cl.
  *H04N 5/374* (2011.01)
  *H01L 31/14* (2006.01)
  *H04N 5/353* (2011.01)
  *H04N 5/3745* (2011.01)
(52) U.S. Cl.
  CPC ........... *H04N 5/378* (2013.01); *H01L 31/143* (2013.01); *H04N 5/353* (2013.01); *H04N 5/37455* (2013.01)

(56) References Cited

U.S. PATENT DOCUMENTS

| | | | | |
|---|---|---|---|---|
| 2005/0218299 | A1* | 10/2005 | Olsen | H03F 3/087 250/214 A |
| 2005/0285958 | A1* | 12/2005 | Matsuda | H04N 5/378 348/300 |
| 2009/0153708 | A1* | 6/2009 | Hirota | H01L 27/14629 348/294 |
| 2010/0207889 | A1* | 8/2010 | Chen | G06F 3/042 345/173 |
| 2010/0238135 | A1* | 9/2010 | Brown | H04N 3/155 345/175 |
| 2011/0198484 | A1* | 8/2011 | Kurokawa | H04N 5/3745 250/214 R |
| 2012/0092536 | A1* | 4/2012 | Hirota | H04N 9/045 348/294 |
| 2013/0070121 | A1* | 3/2013 | Gu | H04N 5/2329 348/239 |
| 2013/0335610 | A1* | 12/2013 | Yamada | H04N 5/351 348/308 |
| 2014/0092287 | A1* | 4/2014 | Jin | H04N 5/378 348/301 |
| 2015/0109498 | A1* | 4/2015 | Aoki | H04N 5/23212 348/280 |
| 2016/0027827 | A1* | 1/2016 | Sekine | H01L 29/78669 250/370.09 |
| 2017/0201700 | A1* | 7/2017 | Hashimoto | H04N 5/37455 |
| 2017/0359542 | A1* | 12/2017 | Bairo | H04N 5/378 |

FOREIGN PATENT DOCUMENTS

| | | |
|---|---|---|
| CN | 108168695 A | 6/2018 |
| JP | 2000224496 A | 8/2000 |

OTHER PUBLICATIONS

CN103259983A, English Abstract and Machine Translation.
CN107426513A, English Abstract and Machine Translation.
CN108168695A, English Abstract and Machine Translation.
JP2000224496A, English Abstract and Machine Translation.
First Office Action for Chinese Application No. 201810782411.9, dated Jul. 16, 2019, 6 Pages.

* cited by examiner

OPTICAL DETECTION PIXEL UNIT, OPTICAL DETECTION CIRCUIT, OPTICAL DETECTION METHOD AND DISPLAY DEVICE

CROSS-REFERENCE TO RELATED APPLICATION

This application claims priority to Chinese Patent Application No. 201810782411.9 filed on Jul. 17, 2018, which is incorporated herein by reference in their entirety.

TECHNICAL FIELD

The present disclosure relates to the field of optical detection technology, and in particular to an optical detection pixel unit, an optical detection pixel circuit, an optical detection method and a display device.

BACKGROUND

In related art, a passive optical detection circuit adopts a charge readout method, in which case reading lines must not be interfered, otherwise a readout result will be significantly affected; while an active optical detection circuit adopts a source follower principle, in which case interference may be overcome and a signal-to-noise ratio may be greatly increased, but an active optical pixel circuit in related art has a complicated structure and occupies a large area because reset transistors and gated transistors are needed therein, which is not favorable for large array integration.

SUMMARY

The present disclosure provides an optical detection pixel unit, including a photosensitive element and a detection transistor, wherein, the photosensitive element has a first electrode connected with a photovoltage terminal, and a second electrode connected with a gate of the detection transistor; and the photosensitive element is configured to detect an optical signal under the control of the photovoltage terminal; and the detection transistor has a first electrode connected with a detection voltage line, and a second electrode connected with a reading line.

According to some embodiments of the present disclosure, the photosensitive element is a photodiode; and an anode of the photodiode is the first electrode of the photosensitive element, and a cathode of the photodiode is the second electrode of the photosensitive element.

According to some embodiments of the present disclosure, the photosensitive element in the optical detection pixel unit of the present disclosure is a photodiode; and an anode of the photodiode is the first electrode of the photosensitive element, and a cathode of the photodiode is the second electrode of the photosensitive element;

a second photovoltage is provided for the photovoltage terminal in a reset stage to turn on the photodiode, so as to reset a potential of the gate of the detection transistor to a reset voltage which is equal to VDH−Vp, a second detection voltage is provided for the detection voltage line in a first reading stage, so as to enable the detection transistor to operate in a saturation status to make the reading line output a first photocurrent corresponding to the reset voltage, a first detection voltage is provided for the detection voltage line in an integration stage to turn off the detection transistor, a first photovoltage is provided for the photovoltage terminal in the integration stage, so as to reverse bias the photodiode to convert an optical signal received by the photodiode into a corresponding current signal, which is used to charge parasitic capacitance of the gate of the detection transistor so as to change the potential of the gate of the detection transistor accordingly, and the second detection voltage is provided for the detection voltage line in a second reading stage, so as to control the detection transistor to operate in a saturation status to make the reading line output a second photocurrent; the second photocurrent is corresponding to the potential of the gate of the detection transistor in the second reading stage; and Vp is a turn-on voltage of the photodiode.

The present disclosure further provides an optical detection method for the aforesaid optical detection pixel unit, wherein in each detection cycle of the optical detection method, a reset stage, an integration stage and a reading stage are sequentially arranged; and the optical detection method includes:

in the reset stage, resetting a potential of the gate of the detection transistor;

in the integration stage, providing a first detection voltage for the detection voltage line to turn off the detection transistor, providing a first photovoltage for the photovoltage terminal, so as to enable the photosensitive element to convert an optical signal received by the photosensitive element into a corresponding current signal, and charging parasitic capacitance of the gate of the detection transistor with the current signal, so as to change the potential of the gate of the detection transistor accordingly; and in the reading stage, providing a second detection voltage for the detection voltage line to control the detection transistor to operate in a saturation status, so as to make the reading line output photocurrent, the photocurrent being corresponding to the potential of the gate of the detection transistor in the reading stage.

According to some embodiments of the present disclosure, the photosensitive element is a photodiode; an anode of the photodiode is the first electrode of the photosensitive element, and a cathode of the photodiode is the second electrode of the photosensitive element; and the optical detection method further includes:

in the reset stage, providing a second photovoltage for the photovoltage terminal to turn on the photodiode so as to reset the potential of the gate of the detection transistor; and in the integration stage, controlling to reverse bias the photodiode, so as to enable the photodiode to detect the optical signal.

The present disclosure further provides an optical detection method for the aforesaid optical detection pixel unit, and the photosensitive element is a photodiode; an anode of the photodiode is the first electrode of the photosensitive element, and a cathode of the photodiode is the second electrode of the photosensitive element; wherein in each detection cycle of the optical detection method, a reset stage, a first reading stage, an integration stage and a second reading stage are sequentially arranged; and the optical detection method includes:

in the reset stage, providing a second photovoltage for the photovoltage terminal to turn on the photodiode so as to reset a potential of the gate of the detection transistor to a reset voltage which is equal to VDH−Vp;

in the first reading stage, providing a second detection voltage for the detection voltage line, so as to enable the detection transistor to operate in a saturation status to make the reading line output a first photocurrent corresponding to the reset voltage; and in the integration stage, providing a first detection voltage for the detection voltage line to turn off the detection transistor, providing a first photovoltage for the photovoltage terminal, so as to reverse bias the photodiode to convert an optical signal received by the photodiode into a corresponding current signal, and charging parasitic capacitance of the gate of the detection transistor with the current signal so as to change the potential of the gate of the detection transistor accordingly;

in the second reading stage, providing the second detection voltage for the detection voltage line, so as to control the detection transistor to operate in a saturation status to make the reading line output a second photocurrent, the second photocurrent being corresponding to the potential of the gate of the detection transistor in the second reading stage; and Vp is a turn-on voltage of the photodiode.

The present disclosure further provides an optical detection circuit, including N rows of detection voltage lines, M columns of reading lines, and optical detection pixel units arranged in N rows and M columns;

the optical detection pixel unit in the $n^{th}$ row and the $m^{th}$ column includes a photosensitive element in the $n^{th}$ row and the $m^{th}$ column and a detection transistor in the $n^{th}$ row and the $m^{th}$ column, wherein the photosensitive element in the $n^{th}$ row and the $m^{th}$ column has a first electrode connected with an $n^{th}$ photovoltage terminal, and a second electrode connected with a gate of the detection transistor in the $n^{th}$ row and the $m^{th}$ column; and the photosensitive element is configured to detect an optical signal under the control of the $n^{th}$ photovoltage terminal;

the detection transistor in the $n^{th}$ row and the $m^{th}$ column has a first electrode connected with a detection voltage line in the $n^{th}$ row, and a second electrode connected with a reading line in the $m^{th}$ column;

an $m^{th}$ current source is connected with the reading line in the $m^{th}$ column for providing an $m^{th}$ constant current for the reading line in the $m^{th}$ column; and both N and M are positive integers, n is a positive integer less than or equal to N, and m is a positive integer less than or equal to M.

According to some embodiments of the present disclosure, the optical detection circuit of the present disclosure further includes sampling sub-circuits; and the sampling sub-circuits are separately connected to the M columns of reading lines for collecting photocurrent therefrom.

According to some embodiments of the present disclosure, the sampling sub-circuit includes M sampling modules; and the sampling modules are corresponding to the reading lines;

the sampling module includes an operational transconductance amplifier, a resistor module and a digital-to-analog converter;

the operational transconductance amplifier has an inverting input terminal connected with the reading line, a positive input terminal connected with a reference voltage, and an output terminal connected to an input terminal of the digital-to-analog converter via the resistor module, and the operational transconductance amplifier is configured to convert a photocurrent output by the reading line into a corresponding analog photovoltage signal; and the digital-to-analog converter is configured to subject the analog photovoltage signal to analog-to-digital conversion to obtain a corresponding digital photovoltage signal.

According to some embodiments of the present disclosure, the photosensitive element in the $n^{th}$ row and the $m^{th}$ column is a photodiode in the $n^{th}$ row and the $m^{th}$ column; and an anode of the photodiode in the $n^{th}$ row and the $m^{th}$ column is the first electrode of the photosensitive element in the $n^{th}$ row and the $m^{th}$ column, and a cathode of the photodiode in the $n^{th}$ row and the $m^{th}$ column is the second electrode of the photosensitive element in the $n^{th}$ row and the $m^{th}$ column; wherein a second photovoltage is provided for the $n^{th}$ photovoltage terminal in a reset stage to turn on the photodiode in the $n^{th}$ row and the $m^{th}$ column, so as to reset a potential of the gate of the detection transistor in the $n^{th}$ row and the $m^{th}$ column, and the photodiode in the $n^{th}$ row and the $m^{th}$ column is controlled to be reverse biased in an integration stage.

According to some embodiments of the present disclosure, the photosensitive element in the $n^{th}$ row and the $m^{th}$ column is a photodiode in the $n^{th}$ row and the $m^{th}$ column; an anode of the photodiode in the $n^{th}$ row and the $m^{th}$ column is the first electrode of the photosensitive element in the $n^{th}$ row and the $m^{th}$ column, and a cathode of the photodiode in the $n^{th}$ row and the $m^{th}$ column is the second electrode of the photosensitive element in the $n^{th}$ row and the $m^{th}$ column; and a second photovoltage is provided for the $n^{th}$ photovoltage terminal in an $n^{th}$ reset stage to turn on the photodiode in the $n^{th}$ row and the $m^{th}$ column, so as to reset a potential of the gate of the detection transistor in the $n^{th}$ row and the $m^{th}$ column to a reset voltage of the $n^{th}$ row and the $m^{th}$ column which is equal to VDH–Vpnm, a second detection voltage is provided for the detection voltage line in the $n^{th}$ row in a first reading stage of the $n^{th}$ row, so as to enable the detection transistor in the $n^{th}$ row and the $m^{th}$ column to operate in a saturation status to make the reading line in the $m^{th}$ column output a first photocurrent corresponding to the reset voltage of the $n^{th}$ row and the $m^{th}$ column, a first detection voltage is provided for the detection voltage line in the $n^{th}$ row in an $n^{th}$ integration stage to turn off the detection transistor in the $n^{th}$ row and the $m^{th}$ column, a first photovoltage is provided for the $n^{th}$ photovoltage terminal in the $n^{th}$ integration stage, so as to reverse bias the photodiode in the $n^{th}$ row and the $m^{th}$ column to convert an optical signal received by the photodiode in the $n^{th}$ row and the $m^{th}$ column into a corresponding current signal, parasitic capacitance of the gate of the detection transistor in the $n^{th}$ row and the $m^{th}$ column is charged with the current signal so as to change the potential of the gate of the detection transistor in the $n^{th}$ row and the $m^{th}$ column accordingly, and the second detection voltage is provided for the detection voltage line in the $n^{th}$ row in a second reading stage of the $n^{th}$ row, so as to control the detection transistor in the $n^{th}$ row and the $m^{th}$ column to operate in a saturation status to make the reading line in the $m^{th}$ column output a second photocurrent, the second photocurrent being corresponding to the potential of the gate of the detection transistor in the $n^{th}$ row and the $m^{th}$ column in the second reading stage of the $n^{th}$ row; Vpnm is a turn-on voltage of the photodiode in the $n^{th}$ row and the $m^{th}$ column.

The present disclosure further provides an optical detection method for the aforesaid optical detection circuit, and the optical detection pixel units in the $n^{th}$ row included in the optical detection circuit are corresponding to an $n^{th}$ detection cycle; the $n^{th}$ detection cycle includes an $n^{th}$ reset stage, an $n^{th}$ integration stage and an $n^{th}$ reading stage, which are sequentially arranged; and the optical detection method includes: in the $n^{th}$ detection cycle, in the $n^{th}$ reset stage, resetting a potential of the gate of the detection transistor in the $n^{th}$ row and the $m^{th}$ column;

in the $n^{th}$ integration stage, providing a first detection voltage for the detection voltage line in the $n^{th}$ row to turn off the detection transistor in the $n^{th}$ row and the $m^{th}$ column, providing a first photovoltage for the $n^{th}$ photovoltage terminal, so as to reverse bias the photodiode in the $n^{th}$ row and the $m^{th}$ column to convert an optical signal received by the photodiode in the $n^{th}$ row and the $m^{th}$ column into a corresponding current signal, and charging parasitic capacitance of the gate of the detection transistor in the $n^{th}$ row and the $m^{th}$ column with the current signal, so as to change the potential of the gate of the detection transistor in the $n^{th}$ row and the $m^{th}$ column accordingly;

in the $n^{th}$ reading stage, providing a second detection voltage for the detection voltage line in the $n^{th}$ row to control the detection transistor in the $n^{th}$ row and the $m^{th}$ column to operate in a saturation status, so as to make the reading line in the $m^{th}$ column output a photocurrent, the photocurrent being corresponding to the potential of the gate of the detection transistor in the $n^{th}$ row and the $m^{th}$ column in the $n^{th}$ reading stage;

the reading stages each included in a detection cycle corresponding to a row of optical detection pixel units included in the optical detection circuit do not overlap with each other; and n is a positive integer less than or equal to N, m is a positive integer less than or equal to M, and both N and M are positive integers.

According to some embodiments of the present disclosure, the photosensitive element in the $n^{th}$ row and the $m^{th}$ column is a photodiode in the $n^{th}$ row and the $m^{th}$ column; an anode of the photodiode in the $n^{th}$ row and the $m^{th}$ column is the first electrode of the photosensitive element in the $n^{th}$ row and the $m^{th}$ column, and a cathode of the photodiode in the $n^{th}$ row and the $m^{th}$ column is the second electrode of the photosensitive element in the $n^{th}$ row and the $m^{th}$ column; and the optical detection method further includes:

in the $n^{th}$ reset stage, providing a second photovoltage for the $n^{th}$ photovoltage terminal to turn on the photodiode in the $n^{th}$ row and the $m^{th}$ column, so as to reset the potential of the gate of the detection transistor in the $n^{th}$ row and the $m^{th}$ column; and in the $n^{th}$ integration stage, controlling to reverse bias the photodiode in the $n^{th}$ row and the $m^{th}$ column, so as to enable the photodiode in the $n^{th}$ row and the $m^{th}$ column to detect the optical signal.

According to some embodiments of the present disclosure, the optical detection circuit further includes sampling sub-circuits; and the optical detection method further includes:

in the $n^{th}$ reading stage, sampling a photocurrent output by the reading line in the $m^{th}$ column with the sampling sub-circuit, and obtaining the optical signal detected by the photodiode in the $n^{th}$ row and the $m^{th}$ column according to the photocurrent output by the reading line in the $m^{th}$ column.

The present disclosure further provides an optical detection method for the aforesaid optical detection circuit, and the photosensitive element in the $n^{th}$ row and the $m^{th}$ column is a photodiode in the $n^{th}$ row and the $m^{th}$ column; an anode of the photodiode in the $n^{th}$ row and the $m^{th}$ column is the first electrode of the photosensitive element in the $n^{th}$ row and the $m^{th}$ column, and a cathode of the photodiode in the $n^{th}$ row and the $m^{th}$ column is the second electrode of the photosensitive element in the $n^{th}$ row and the $m^{th}$ column; and the optical detection pixel units in the $n^{th}$ row included in the optical detection circuit are corresponding to an $n^{th}$ detection cycle; the $n^{th}$ detection cycle includes an $n^{th}$ reset stage, a first reading stage of the $n^{th}$ row, an $n^{th}$ integration stage and a second reading stage of the $n^{th}$ row, which are sequentially arranged; and the optical detection method includes: in the $n^{th}$ detection cycle, in the $n^{th}$ reset stage, providing a second photovoltage for the $n^{th}$ photovoltage terminal to turn on the photodiode in the $n^{th}$ row and the $m^{th}$ column, so as to reset a potential of the gate of the detection transistor in the $n^{th}$ row and the $m^{th}$ column to a reset voltage of the $n^{th}$ row and the $m^{th}$ column, which is equal to VDH−Vpnm;

in the first reading stage of the $n^{th}$ row, providing a second detection voltage for the detection voltage line in the $n^{th}$ row to control the detection transistor in the $n^{th}$ row and the $m^{th}$ column to operate in a saturation status, so as to make the reading line in the $m^{th}$ column output a first photocurrent, the first photocurrent being corresponding to the reset voltage of the $n^{th}$ row and the $m^{th}$ column;

in the $n^{th}$ integration stage, providing a first detection voltage for the detection voltage line in the $n^{th}$ row to turn off the detection transistor in the $n^{th}$ row and the $m^{th}$ column, providing a first photovoltage for the $n^{th}$ photovoltage terminal, so as to reverse bias the photodiode in the $n^{th}$ row and the $m^{th}$ column to convert an optical signal received by the photodiode in the $n^{th}$ row and the $m^{th}$ column into a corresponding current signal, and charging parasitic capacitance of the gate of the detection transistor in the $n^{th}$ row and the $m^{th}$ column with the current signal, so as to change the potential of the gate of the detection transistor in the $n^{th}$ row and the $m^{th}$ column accordingly;

in the second reading stage of the $n^{th}$ row, providing the second detection voltage for the detection voltage line in the $n^{th}$ row to control the detection transistor in the $n^{th}$ row and the $m^{th}$ column to operate in a saturation status, so as to make the reading line in the $m^{th}$ column output a second photocurrent, the second photocurrent being corresponding to the potential of the gate of the detection transistor in the $n^{th}$ row and the $m^{th}$ column in the second reading stage of the $n^{th}$ row;

Vpnm is a turn-on voltage of the photodiode in the $n^{th}$ row and the $m^{th}$ column;

the first reading stages each included in a detection cycle corresponding to a row of optical detection pixel units included in the optical detection circuit do not overlap with each other; the second reading stages each included in a detection cycle corresponding to a row of optical detection pixel units included in the optical detection circuit do not overlap with each other; the first reading stages each included in a detection cycle corresponding to a row of optical detection pixel units included in the optical detection circuit, and the second reading stages each included in a detection cycle corresponding to a row of optical detection pixel units included in the optical detection circuit do not overlap with each other; and the second reading stages each included in a detection cycle corresponding to a row of optical detection pixel units included in the optical detection circuit, and the first reading stages each included in a detection cycle corresponding to a row of optical detection pixel units included in the optical detection circuit do not overlap with each other; and n is a positive integer less than or equal to N, m is a positive integer less than or equal to M, and both N and M are positive integers.

According to some embodiments of the present disclosure, the optical detection circuit further includes sampling sub-circuits; the optical detection method further includes:

in the first reading stage of the $n^{th}$ row, sampling by a corresponding sampling sub-circuit a first photocurrent output on the reading line in the $m^{th}$ column;

in the second reading stage of the $n^{th}$ row, sampling by a corresponding sampling sub-circuit a second photocurrent output on the reading line in the $m^{th}$ column; and obtaining the optical signal detected by the photodiode in the $n^{th}$ row and the $m^{th}$ column on the basis of a difference between the second photocurrent and the first photocurrent.

The present disclosure further provides a display device, including the aforesaid optical detection circuit.

DETAILED DESCRIPTION

The technical solutions of the embodiments of the present disclosure will be described hereinafter in details in conjunction with the drawings of the embodiments of the present disclosure. Obviously, the embodiments described hereinafter are only some embodiments of the present disclosure, but do not include all embodiments. Based on the embodiments of the present disclosure, all other embodiments obtained by those of ordinary skill in the art without any creative work should be considered to fall within the protection scope of the present disclosure.

Transistors used in all embodiments of the present disclosure may be thin film transistors, or field effect transistors, or other devices having the same characteristics. In the embodiments of the present disclosure, for differentiating between two electrodes of a transistor except a gate, one of them is named as a first electrode, and the other one is named as a second electrode. In practical application, the first electrode may be a drain, and the second electrode may be a source; or, the first electrode may be a source, and the second electrode may be a drain.

Figure 1:
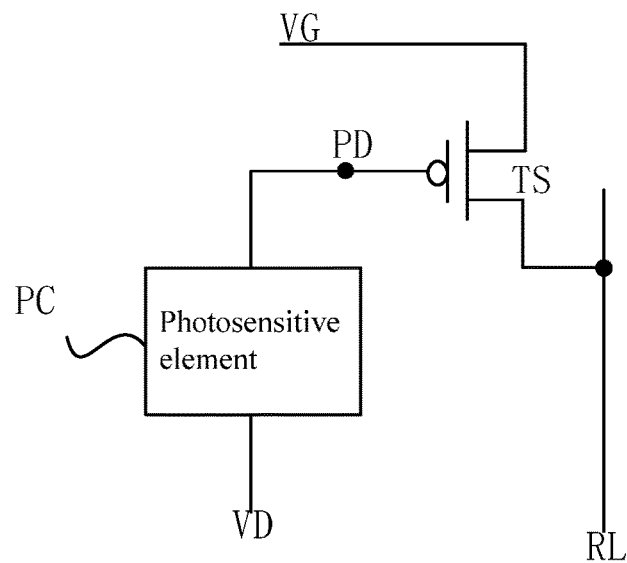
FIG. 1 is a schematic structural diagram of an optical detection pixel unit according to embodiments of the present disclosure.

As shown in FIG. 1, an optical detection pixel unit according to the embodiments of the present disclosure includes a photosensitive element PC and a detection transistor TS, wherein, the photosensitive element PC has a first electrode connected with a photovoltage terminal VD, and a second electrode connected with a gate of the detection transistor TS; and the photosensitive element PC is configured to detect an optical signal under the control of the photovoltage terminal VD; and the detection transistor TS has a first electrode connected with a detection voltage line VG, and a second electrode connected with a reading line RL.

In FIG. 1, a photoelectric node PD is a node at which the second electrode of the photosensitive element PC is connected with the gate of the detection transistor TS.

The detection transistor TS is a P-type transistor in the embodiment illustrated by FIG. 1, while it may be an N-type transistor in practical application.

In the embodiment illustrated by FIG. 1, since the detection transistor TS is a P-type transistor, the first electrode of the detection transistor TS is a source, and the second electrode of the detection transistor TS is a drain.

According to some embodiments of the present disclosure, the photosensitive element PC may be a photodiode, but is not limited thereto; when the photosensitive element PC is a photodiode, the first electrode of the photosensitive element PC is an anode of the photodiode, and the second electrode of the photosensitive element PC is a cathode of the photodiode.

The optical detection pixel unit according to the embodiments of the present disclosure obviates the need for reset transistors and gated transistors, and achieves active photosensitive detection by use of a 1T1P structure. Since the optical detection pixel unit according to the embodiments of the present disclosure uses a small number of transistors, it is easy to be applied in large array integration.

In the embodiments of the present disclosure, the detection transistor is kept in different states by controlling a gate potential and a source potential of the detection transistor for integration or reading. The optical detection pixel unit according to the embodiments of the present disclosure is an active photosensitive detection pixel unit adopting a source following design, so that it retains the advantages of the active optical pixel structure, such as good anti-noise performance, in comparison with a passive photosensitive detection pixel unit, but it does not increase an area of an optical pixel structure, which is favorable for large array integration in comparison with a conventional 3T1P structure (which is an optical pixel unit composed of three transistors and one photodiode).

According to some embodiments of the present disclosure, the optical detection pixel unit of the present disclosure may be driven by a control sub-circuit included in an optical detection circuit as follows:

the control sub-circuit is configured to reset a potential of the gate of the detection transistor TS (that is, resetting a potential of the photoelectric node PD) in a reset stage, provide a first detection voltage for the detection voltage line VG in an integration stage to turn off the detection transistor TS, provide a first photovoltage for the photovoltage terminal VD in the integration stage so as to enable the photosensitive element PC to convert an optical signal received by the photosensitive element PC into a corresponding current signal, charge parasitic capacitance (not shown in FIG. 1) of the gate of the detection transistor TS with the current signal so as to change the potential of the gate of the detection transistor TS accordingly, and provide a second detection voltage for the detection voltage line VG in a reading stage so as to control the detection transistor TS to operate in a saturation status to make the reading line RL output photocurrent, the photocurrent being corresponding to the potential of the gate of the detection transistor TS (that is, the potential of the photoelectric node PD) in the reading stage.

According to some embodiments of the present disclosure, the first photovoltage may be a low photovoltage VDL, but is not limited thereto.

Specifically, the photosensitive element may be a photodiode; an anode of the photodiode is the first electrode of the photosensitive element, and a cathode of the photodiode is the second electrode of the photosensitive element.

The control sub-circuit is specifically configured to provide a second photovoltage for the photovoltage terminal in the reset stage to turn on the photodiode so as to reset the potential of the gate of the detection transistor, and further to reverse bias the photodiode in the integration stage so as to enable the photodiode to detect the optical signal.

According to some embodiments of the present disclosure, the second photovoltage may be a high photovoltage VDH, but is not limited thereto.

Figure 2:
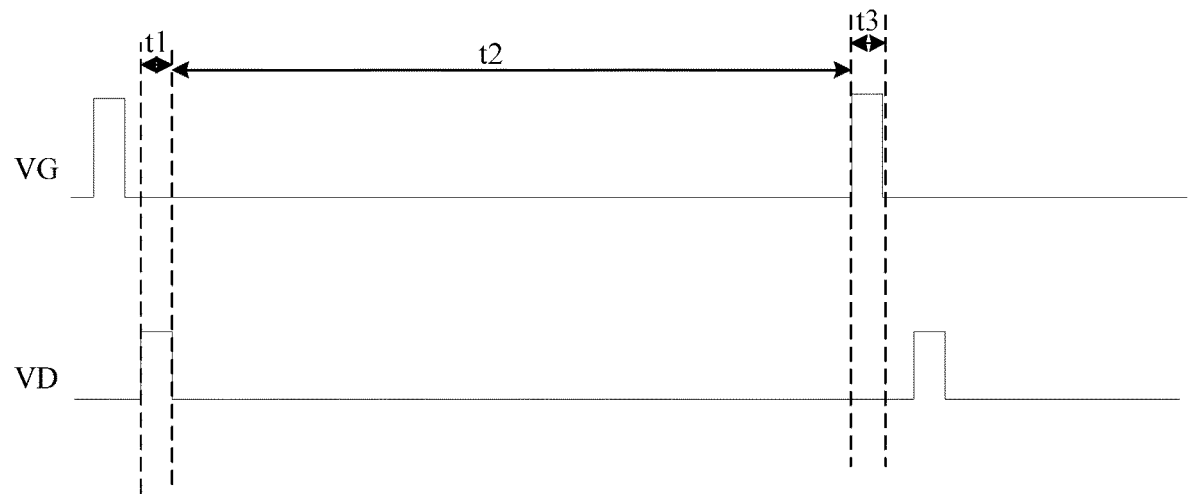
FIG. 2 is a working sequence diagram of the optical detection pixel unit according to the embodiments of the present disclosure.

As shown in FIG. 2, in the reset stage t1, a potential of the photovoltage terminal VD is pulled up to the second photovoltage (which may be the high photovoltage VDH in a time sequence shown in FIG. 2), and a potential of the second electrode of the photosensitive element PC, that is, the potential of the photoelectric node PD, is reset to VDH−Von (Von is a turn-on voltage of the photosensitive element PC);

in the integration stage t2, the first detection voltage (which may be a low detection voltage VGL in the time sequence shown in FIG. 2) is provided for the detection voltage line VG to turn off the detection transistor TS, and the first photovoltage (which may be a low photovoltage VDL in the time sequence shown in FIG. 2) is provided for the photovoltage terminal VD, so as to enable the photosensitive element PC to convert the optical signal received by the photosensitive element PC into the corresponding current signal, which is used to charge the parasitic capacitance (not shown in FIG. 1) of the gate of the detection transistor TS, so as to change the potential of the gate of the detection transistor TS accordingly (that is, changing the potential Vpd of the photoelectric node PD accordingly);

in the reading stage t3, the second detection voltage (which may be a high detection voltage VGH in the time sequence shown in FIG. 2, the high detection voltage VGH being greater than the low detection voltage VGL) is provided for the detection voltage line VG, in which case a gate-source voltage Vgs of the detection transistor TS satisfies Vgs=Vpd−VGH, Vpd−VGH is made to be less than a threshold voltage Vth of the detection transistor TS, and a drain-source voltage Vds of the detection transistor TS is made to be less than Vpd−VGH−Vth, so as to control the detection transistor TS to operate in a saturation status to make the reading line RL output the photocurrent Ip, the photocurrent IP being corresponding to the potential of the gate of the detection transistor TS (that is, the potential Vpd of the photoelectric node PD) in the reading stage t3;

$$Ip = -\tfrac{1}{2} \times K \times (Vgs-Vth)^2$$

where K is a current coefficient of the detection transistor TS.

When the detection transistor TS in FIG. 1 is replaced with an N-type transistor, it should be ensured that Vds is greater than Vpd−VGH−Vth in the reading stage t3 so as to enable the detection transistor TS to operate in a saturation status.

In some embodiments of the present disclosure, the photosensitive element is a photodiode; and an anode of the photodiode is the first electrode of the photosensitive element, and a cathode of the photodiode is the second electrode of the photosensitive element;

the control sub-circuit is configured to provide a second photovoltage for the photovoltage terminal in a reset stage to turn on the photodiode, so as to reset a potential of the gate of the detection transistor to a reset voltage which is equal to VDH−Vp, provide a second detection voltage for the detection voltage line in a first reading stage, so as to enable the detection transistor to operate in a saturation status to make the reading line output a first photocurrent corresponding to the reset voltage, provide a first detection voltage for the detection voltage line in an integration stage to turn off the detection transistor, provide a first photovoltage for the photovoltage terminal in the integration stage, so as to reverse bias the photodiode to convert an optical signal received by the photodiode into a corresponding current signal, charge parasitic capacitance of the gate of the detection transistor with the current signal so as to change the potential of the gate of the detection transistor accordingly, and provide the second detection voltage for the detection voltage line in a second reading stage, so as to control the detection transistor to operate in a saturation status to make the reading line output a second photocurrent; the second photocurrent is corresponding to the potential of the gate of the detection transistor in the second reading stage; and Vp is a turn-on voltage of the photodiode.

According to some embodiments of the present disclosure, when the photosensitive element is a photodiode, there will be detection errors due to a difference in turn-on voltages of the photodiodes when the potential of the gate of the detection transistor (that is, the potential of the photoelectric node) is reset, therefore, two reading stages are arranged after the reset stage for the optical detection pixel unit according to the embodiments of the present disclosure, so as to counteract the effect of the turn-on voltage of the photodiode on a final detection result, which will be described in details below in conjunction with the sequence diagrams.

Figure 3:
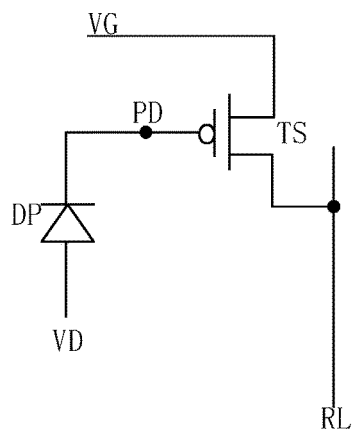
FIG. 3 is a circuit diagram of the optical detection pixel unit according to the embodiments of the present disclosure.

As shown in FIG. 3, the optical detection pixel unit according to the embodiments of the present disclosure includes a photodiode DP and a detection transistor TS, wherein, the photodiode DP has an anode connected with the photovoltage terminal VD, and a cathode connected with the gate of the detection transistor TS; and the photodiode DP is configured to detect an optical signal under the control of the photovoltage terminal VD; and the detection transistor TS has a source connected with the detection voltage line VG, and a drain connected with the reading line RL.

In FIG. 3, the photoelectric node PD is a node connected with the gate of the detection transistor TS.

The detection transistor TS is a P-type transistor in the embodiment illustrated by FIG. 3, but is not limited thereto.

As shown in FIG. 2, when the optical detection pixel unit of the present disclosure as shown in FIG. 3 operates, in a reset stage t1, the potential of the photovoltage terminal VD is pulled up to the high photovoltage VDH, so as to reset a potential of the anode of the photodiode DP, that is, the potential of the photoelectric node PD, to VDH−Vp (Vp is the turn-on voltage of the photodiode DP);

in an integration stage t2, the low detection voltage VGL is provided for the detection voltage line VG to turn off the detection transistor TS, and the low photovoltage VDL is provided for the photovoltage terminal VD, so as to make the photodiode DP in a reverse biased state to enable the photodiode DP to convert the optical signal received by the photodiode DP into the corresponding current signal, which is used to charge the parasitic capacitance (not shown in FIG. 3) of the gate of the detection transistor TS, so as to change the potential of the gate of the detection transistor TS accordingly (that is, changing the potential Vpd of the photoelectric node PD accordingly); and in a reading stage t3, the high detection voltage VGH is provided for the detection voltage line VG, in which case the gate-source voltage Vgs of the detection transistor TS is equal to Vpd−VGH, Vpd−VGH is made to be less than the threshold voltage Vth of the detection transistor TS, and the drain-source voltage Vds of the detection transistor TS is made to be less than Vpd−VGH−Vth, so as to control the detection transistor TS to operate in a saturation status to make the reading line RL output the photocurrent Ip, the photocurrent IP being corresponding to the potential of the gate of the detection transistor TS (that is, the potential of the photoelectric node PD) in the reading stage t3.

In practical application, a difference in the turn-on voltage of the photodiode DP caused by PIN processes will lead to a difference in the reset potential VDH−Vp of the photodiode DP, therefore, the time sequence shown in FIG. 2 may be improved in such a way that a sampling process is performed after the resetting process, and a sample value obtained after the integration process is subtracted, so as to counteract the difference in the turn-on voltage Vp.

Figure 4:
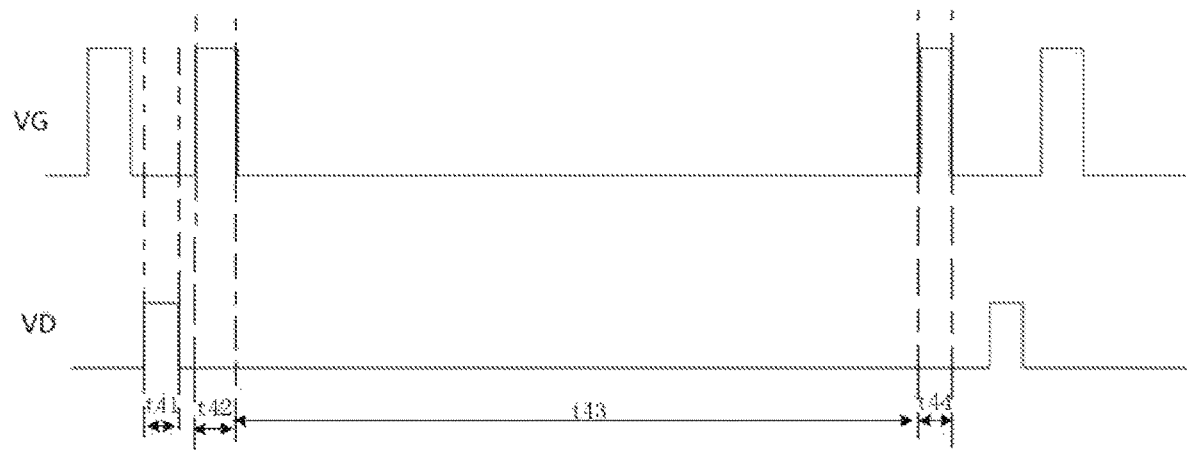
FIG. 4 is a working sequence diagram of the optical detection pixel unit shown in FIG. 3.

As shown in FIG. 4, when the optical detection pixel unit of the present disclosure as shown in FIG. 3 operates, in a reset stage t41, the high photovoltage VDH is provided for the photovoltage terminal VD to turn on the photodiode DP, so as to reset the potential of the gate of the detection transistor TS (that is, the potential Vpd of the photoelectric node PD) to the reset voltage which is equal to VDH−Vp; wherein, Vp is the turn-on voltage of the photodiode DP);

in a first reading stage t42, the high detection voltage VGH is provided for the detection voltage line VG, in which case the gate-source voltage Vgs of the detection transistor TS is equal to Vpd−VGH, Vpd−VGH is made to be less than the threshold voltage Vth of the detection transistor TS, and the drain-source voltage Vds of the detection transistor TS is made to be less than Vpd−VGH−Vth, so as to control the detection transistor TS to operate in a saturation status to make the reading line RL output a first photocurrent Ip1 corresponding to the reset voltage;

in an integration stage t43, the low detection voltage VGL is provided for the detection voltage line VG to turn off the detection transistor TS, and the low photovoltage VDL is provided for the photovoltage terminal VD, so as to reverse bias the photodiode DP to convert the optical signal received by the photodiode DP into the corresponding current signal, which is used to charge the parasitic capacitance (not shown in FIG. 3) of the gate of the detection transistor TS, so as to change the potential of the gate of the detection transistor TS accordingly (that is, changing the potential Vpd of the photoelectric node PD accordingly);

in a second reading stage t44, the high detection voltage VGH is provided for the detection voltage line VG to control the detection transistor TS to operate in a saturation status, so as to make the reading line RL output a second photocurrent Ip2 corresponding to the potential of the gate of the detection transistor TS in the second reading stage t44; Vp is the turn-on voltage of the photodiode DP; and the optical signal detected by the photodiode may be obtained on the basis of a difference between Ip2 and Ip1, so as to obviate the detection errors due to the difference in the turn-on voltage Vp of the photodiode DP.

An optical detection method according to the embodiments of the present disclosure is applied to the aforesaid optical detection pixel unit, and in each detection cycle of the optical detection method, a reset stage, an integration stage and a reading stage are sequentially arranged; and the optical detection method includes:

in the reset stage, resetting a potential of the gate of the detection transistor;

in the integration stage, providing a first detection voltage for the detection voltage line to turn off the detection transistor, providing a first photovoltage for the photovoltage terminal, so as to enable the photosensitive element to convert an optical signal received by the photosensitive element into a corresponding current signal, and charging parasitic capacitance of the gate of the detection transistor with the current signal, so as to change the potential of the gate of the detection transistor accordingly;

in the reading stage, providing a second detection voltage for the detection voltage line to control the detection transistor to operate in a saturation status, so as to make the reading line output photocurrent, the photocurrent being corresponding to the potential of the gate of the detection transistor in the reading stage; and calculating the optical signal received by the photosensitive element according to the photocurrent.

Specifically, the photosensitive element is a photodiode; an anode of the photodiode is the first electrode of the photosensitive element, and a cathode of the photodiode is the second electrode of the photosensitive element; and the optical detection method further includes:

in the reset stage, providing a second photovoltage for the photovoltage terminal to turn on the photodiode so as to reset the potential of the gate of the detection transistor; and in the integration stage, controlling to reverse bias the photodiode, so as to enable the photodiode to detect the optical signal.

An optical detection method according to the embodiments of the present disclosure is applied to the aforesaid optical detection pixel unit, and the photosensitive element is a photodiode; an anode of the photodiode is the first electrode of the photosensitive element, and a cathode of the photodiode is the second electrode of the photosensitive element; wherein in each detection cycle of the optical detection method, a reset stage, a first reading stage, an integration stage and a second reading stage are sequentially arranged; and the optical detection method includes:

in the reset stage, providing a second photovoltage for the photovoltage terminal to turn on the photodiode so as to reset a potential of the gate of the detection transistor to a reset voltage which is equal to VDH−Vp;

in the first reading stage, providing a second detection voltage for the detection voltage line, so as to enable the detection transistor to operate in a saturation status to make the reading line output a first photocurrent corresponding to the reset voltage;

in the integration stage, providing a first detection voltage for the detection voltage line to turn off the detection transistor, providing a first photovoltage for the photovoltage terminal, so as to reverse bias the photodiode to convert an optical signal received by the photodiode into a corresponding current signal, and charging parasitic capacitance of the gate of the detection transistor with the current signal so as to change the potential of the gate of the detection transistor accordingly; and in the second reading stage, providing the second detection voltage for the detection voltage line, so as to control the detection transistor to operate in a saturation status to make the reading line output a second photocurrent, the second photocurrent being corresponding to the potential of the gate of the detection transistor in the second reading stage; Vp is a turn-on voltage of the photodiode; and calculating the optical signal detected by the photodiode on the basis of a difference between the second photocurrent and the first photocurrent.

An optical detection circuit according to the embodiments of the present disclosure includes N rows of detection voltage lines, M columns of reading lines, and optical detection pixel units arranged in N rows and M columns;

the optical detection unit in the $n^{th}$ row and the $m^{th}$ column includes a photosensitive element in the $n^{th}$ row and the $m^{th}$ column and a detection transistor in the $n^{th}$ row and the $m^{th}$ column, wherein the photosensitive element in the $n^{th}$ row and the $m^{th}$ column has a first electrode connected with an $n^{th}$ photovoltage terminal, and a second electrode connected with a gate of the detection transistor in the $n^{th}$ row and the $m^{th}$ column; and the photosensitive element is configured to detect an optical signal under the control of the $n^{th}$ photovoltage terminal;

the detection transistor in the $n^{th}$ row and the $m^{th}$ column has a first electrode connected with a detection voltage line in the $n^{th}$ row, and a second electrode connected with a reading line in the $m^{th}$ column;

an $m^{th}$ current source CS-m is connected with the reading line in the $m^{th}$ column for providing an $m^{th}$ constant current for the reading line in the $m^{th}$ column; and both N and M are positive integers, n is a positive integer less than or equal to N, and m is a positive integer less than or equal to M.

According to some embodiments of the present disclosure, the optical detection circuit of the present disclosure may further include sampling sub-circuits; and the sampling sub-circuits are separately connected to the M columns of reading lines for collecting photocurrent therefrom.

Figure 5:
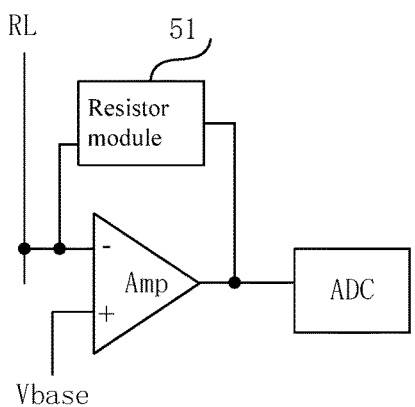
FIG. 5 is a schematic structural diagram of a sampling module included in a sampling sub-circuit in an optical detection circuit according to the embodiments of the present disclosure.

Specifically, the sampling sub-circuit may include M sampling modules; and the sampling modules are corresponding to the reading lines;

as shown in FIG. 5, the sampling module may include an operational transconductance amplifier Amp, a resistor module 51 and a digital-to-analog converter ADC;

the operational transconductance amplifier Amp has an inverting input terminal connected with the reading line RL, a positive input terminal connected with a reference voltage Vbase, and an output terminal connected to an input terminal of the digital-to-analog converter ADC via the resistor module 51, and the operational transconductance amplifier Amp is configured to convert a photocurrent output by the reading line RL into a corresponding analog photovoltage signal; and the digital-to-analog converter ADC is configured to subject the analog photovoltage signal to analog-to-digital conversion to obtain a corresponding digital photovoltage signal; and the optical signal detected by the photosensitive element may be obtained according to the digital photovoltage signal.

According to some embodiments of the present disclosure, a control sub-circuit controls and executes a driving process to reset a potential of the gate of the detection transistor in the $n^{th}$ row and the $m^{th}$ column in an $n^{th}$ reset stage, provide a first detection voltage for the detection voltage line in the $n^{th}$ row in an $n^{th}$ integration stage to turn off the detection transistor in the $n^{th}$ row and the $m^{th}$ column, provide a first photovoltage for the $n^{th}$ photovoltage terminal in the $n^{th}$ integration stage so as to enable the photosensitive element in the $n^{th}$ row and the $m^{th}$ column to convert an optical signal received by the photosensitive element in the $n^{th}$ row and the $m^{th}$ column into a corresponding current signal, charge parasitic capacitance of the gate of the detection transistor in the $n^{th}$ row and the $m^{th}$ column with the current signal so as to change the potential of the gate of the detection transistor in the $n^{th}$ row and the $m^{th}$ column accordingly, and provide a second detection voltage for the detection voltage line in the $n^{th}$ row in an $n^{th}$ reading stage so as to control the detection transistor in the $n^{th}$ row and the $m^{th}$ column to operate in a saturation status to make the reading line in the $m^{th}$ column output an $m^{th}$ photocurrent, the $m^{th}$ photocurrent being corresponding to the potential of the gate of the detection transistor in the $n^{th}$ row and the $m^{th}$ column in the $n^{th}$ reading stage; and the optical signal detected by the photosensitive element in the $n^{th}$ row and the $m^{th}$ column may be calculated according to the $m^{th}$ photocurrent.

According to some embodiments of the present disclosure, the photosensitive element in the $n^{th}$ row and the $m^{th}$ column may be a photodiode in the $n^{th}$ row and the $m^{th}$ column; an anode of the photodiode in the $n^{th}$ row and the $m^{th}$ column is the first electrode of the photosensitive element in the $n^{th}$ row and the $m^{th}$ column, and a cathode of the photodiode in the $n^{th}$ row and the $m^{th}$ column is the second electrode of the photosensitive element in the $n^{th}$ row and the $m^{th}$ column; and the control sub-circuit is specifically configured to provide a second photovoltage for the $n^{th}$ photovoltage terminal in the reset stage to turn on the photodiode in the $n^{th}$ row and the $m^{th}$ column so as to reset the potential of the gate of the detection transistor in the $n^{th}$ row and the $m^{th}$ column, and further to reverse bias the photodiode in the $n^{th}$ row and the $m^{th}$ column in the integration stage.

According to another specific implementation, the photosensitive element in the $n^{th}$ row and the $m^{th}$ column is a photodiode in the $n^{th}$ row and the $m^{th}$ column; an anode of the photodiode in the $n^{th}$ row and the $m^{th}$ column is the first electrode of the photosensitive element in the $n^{th}$ row and the $m^{th}$ column, and a cathode of the photodiode in the $n^{th}$ row and the $m^{th}$ column is the second electrode of the photosensitive element in the $n^{th}$ row and the $m^{th}$ column;

the control sub-circuit is configured to provide a second photovoltage for the $n^{th}$ photovoltage terminal in an $n^{th}$ reset stage to turn on the photodiode in the $n^{th}$ row and the $m^{th}$ column, so as to reset a potential of the gate of the detection transistor in the $n^{th}$ row and the $m^{th}$ column to a reset voltage of the $n^{th}$ row and the $m^{th}$ column which is equal to VDH−Vpnm, provide a second detection voltage for the detection voltage line in the $n^{th}$ row in a first reading stage of the $n^{th}$ row, so as to enable the detection transistor in the $n^{th}$ row and the $m^{th}$ column to operate in a saturation status to make the reading line in the $m^{th}$ column output a first photocurrent corresponding to the reset voltage of the $n^{th}$ row and the $m^{th}$ column, provide a first detection voltage for the detection voltage line in the $n^{th}$ row in an $n^{th}$ integration stage to turn off the detection transistor in the $n^{th}$ row and the $m^{th}$ column, provide a first photovoltage for the $n^{th}$ photovoltage terminal in the $n^{th}$ integration stage, so as to reverse bias the photodiode in the $n^{th}$ row and the $m^{th}$ column to convert an optical signal received by the photodiode in the $n^{th}$ row and the $m^{th}$ column into a corresponding current signal, charge parasitic capacitance of the gate of the detection transistor in the $n^{th}$ row and the $m^{th}$ column with the current signal so as to change the potential of the gate of the detection transistor in the $n^{th}$ row and the $m^{th}$ column accordingly, and provide the second detection voltage for the detection voltage line in the $n^{th}$ row in a second reading stage of the $n^{th}$ row, so as to control the detection transistor in the $n^{th}$ row and the $m^{th}$ column to operate in a saturation status to make the reading line in the $m^{th}$ column output a second photocurrent, the second photocurrent being corresponding to the potential of the gate of the detection transistor in the $n^{th}$ row and the $m^{th}$ column in the second reading stage of the $n^{th}$ row; Vpnm is a turn-on voltage of the photodiode in the $n^{th}$ row and the $m^{th}$ column; and the optical signal detected by the photodiode in the $n^{th}$ row and the $m^{th}$ column may be calculated on the basis of a difference between the second photocurrent and the first photocurrent.

Figure 6:
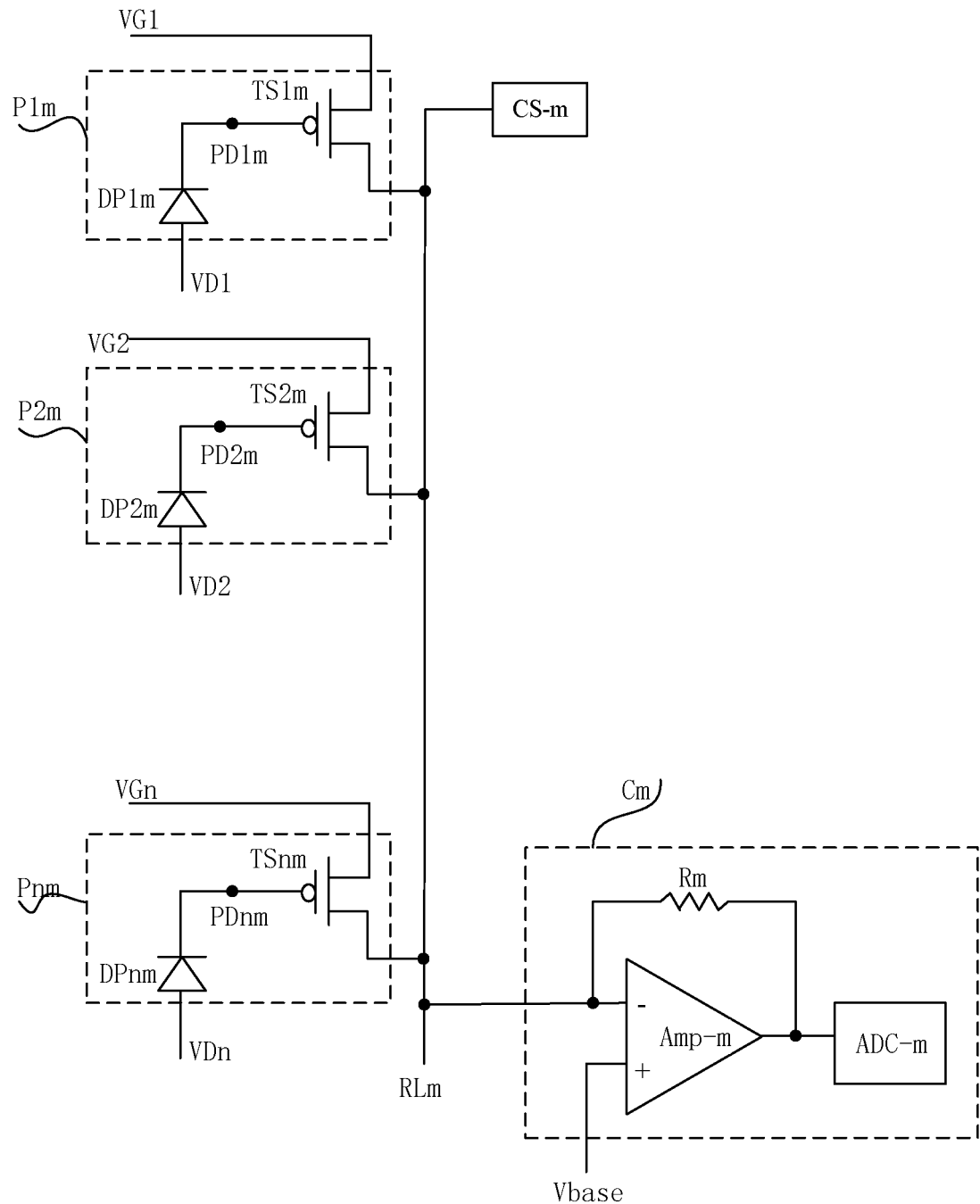
FIG. 6 is a schematic structural diagram of the optical detection pixel units in the $m^{th}$ column and the $m^{th}$ sampling module Cm connected thereto, which are included in the optical detection circuit according to the embodiments of the present disclosure.

FIG. 6 shows a schematic structural diagram of the optical detection pixel units in the $m^{th}$ column and the $m^{th}$ sampling module Cm connected thereto, which are included in the optical detection circuit according to the embodiments of the present disclosure.

As shown in FIG. 6, the optical detection pixel unit P1m in the first row and the $m^{th}$ column includes a photodiode DP1m in the first row and the $m^{th}$ column and a detection transistor TS1m in the first row and the $m^{th}$ column;

the photodiode DP1m has an anode connected with a first photovoltage terminal VD1, and a cathode connected with a gate of the detection transistor TS1m; and the photodiode DP1m is configured to detect an optical signal under the control of the first photovoltage terminal VD1;

the detection transistor TS1m has a source connected with a detection voltage line VG1 in the first row, and a drain connected with a reading line RLm in the $m^{th}$ column;

a photoelectric node PD1m in the first row and the $m^{th}$ column is a node connected with the gate of the detection transistor TS1m;

the optical detection pixel unit P2m in the second row and the $m^{th}$ column includes a photodiode DP2m in the second row and the $m^{th}$ column and a detection transistor TS2m in the second row and the $m^{th}$ column;

the photodiode DP2m has an anode connected with a second photovoltage terminal VD2, and a cathode connected with a gate of the detection transistor TS2m; and the photodiode DP2m is configured to detect an optical signal under the control of the second photovoltage terminal VD2;

the detection transistor TS2m has a source connected with a detection voltage line VG2 in the second row, and a drain connected with the reading line RLm in the $m^{th}$ column;

a photoelectric node PD2m in the second row and the $m^{th}$ column is a node connected with the gate of the detection transistor TS2m;

the optical detection pixel unit Pnm in the $n^{th}$ row and the $m^{th}$ column includes a photodiode DPnm in the $n^{th}$ row and the $m^{th}$ column and a detection transistor TSnm in the $n^{th}$ row and the $m^{th}$ column;

the photodiode DPnm has an anode connected with an $n^{th}$ photovoltage terminal VDn, and a cathode connected with a gate of the detection transistor TSnm; and the photodiode DPnm is configured to detect an optical signal under the control of the $n^{th}$ photovoltage terminal VDn;

the detection transistor TSnm has a source connected with a detection voltage line VGn in the $n^{th}$ row, and a drain connected with the reading line RLm in the $m^{th}$ column;

a photoelectric node PDnm in the $n^{th}$ row and the $m^{th}$ column is a node connected with the gate of the detection transistor TS2m;

the $m^{th}$ sampling module Cm is connected with the reading line RLm;

the $m^{th}$ sampling module Cm includes an $m^{th}$ operational transconductance amplifier Amp-m, an $m^{th}$ resistor Rm and an $m^{th}$ digital-to-analog converter ADC-m;

the $m^{th}$ operational transconductance amplifier Amp-m has an inverting input terminal connected with the reading line RLm, a positive input terminal connected with a reference voltage Vbase, and an output terminal connected to an input terminal of the $m^{th}$ digital-to-analog converter ADC-m via the $m^{th}$ resistor Rm, and the $m^{th}$ operational transconductance amplifier Amp-m is configured to convert a photocurrent output by the reading line RLm into a corresponding analog photovoltage signal; and the $m^{th}$ digital-to-analog converter ADC-m is configured to subject the analog photovoltage signal to analog-to-digital conversion to obtain a corresponding digital photovoltage signal; and the optical signal detected by the corresponding photodiode may be obtained according to the digital photovoltage signal.

In the embodiment illustrated by FIG. 6, all the transistors are P-type transistors, but are not limited thereto.

Figure 7:
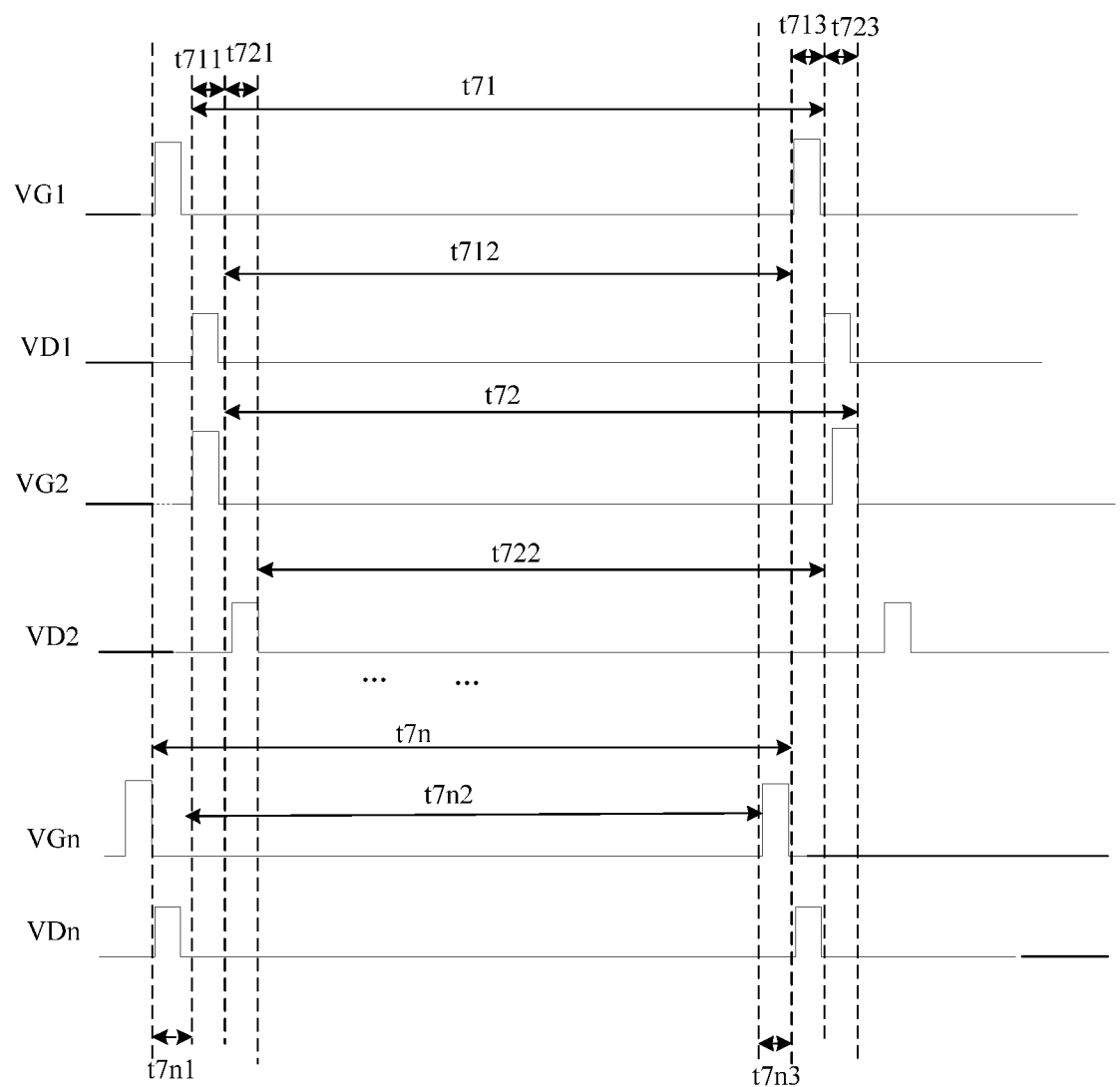
FIG. 7 is a first working sequence diagram of the optical detection pixel units in the $m^{th}$ column shown in FIG. 6.

As shown in FIG. 7, when the optical detection pixel units in the $m^{th}$ column and the $m^{th}$ sampling module Cm connected thereto, which are included in the optical detection circuit as shown in FIG. 6, operates, the optical detection pixel unit in the first row and the $m^{th}$ column is corresponding to a first detection cycle t71, which includes a first reset stage t711, a first integration stage t712 and a first reading stage t713, which are sequentially arranged;

the optical detection pixel unit in the second row and the $m^{th}$ column is corresponding to a second detection cycle t72, which includes a second reset stage t721, a second integration stage t722 and a second reading stage t723, which are sequentially arranged; and the optical detection pixel unit in the $n^{th}$ row and the $m^{th}$ column is corresponding to an $n^{th}$ detection cycle t7n, which includes an $n^{th}$ reset stage t7n1, an $n^{th}$ integration stage t7n2 and an $n^{th}$ reading stage t7n3, which are sequentially arranged.

In the embodiment illustrated by FIG. 7, a control sub-circuit included in the optical detection circuit executes a driving process in a following exemplary way, wherein, as for the optical detection pixel unit in the first row and the $m^{th}$ column, in the first reset stage t711, a potential of the detection voltage line VG1 is pulled down to turn off the detection transistor TS1m, a potential of the first photovoltage terminal VD1 is pulled up to a high photovoltage VDH to reset a potential of the photoelectric node PD1m, in which case the potential of the photoelectric node PD1m is equal to VDH−Vp1m, Vp1m being a turn-on voltage of the photodiode DP1m;

in the first integration stage t712, the potential of the first photovoltage terminal VD1 is pulled down to a low photovoltage VDL to make the photodiode DP1m in a reverse biased state so as to enable the photodiode DP1m to convert an optical signal received by the photodiode DP1m into a corresponding current signal, an integration process is begun, and parasitic capacitance of the gate of the detection transistor TS1m is charged with the current signal so as to change a potential of the gate of the detection transistor TS1m accordingly;

in the first reading stage t713, the potential of the detection voltage line VG1 is pulled up to a high detection voltage VGH again, in which case a gate-source voltage of the detection transistor TS1m is equal to Vpd1m−VGH, Vpd1m−VGH is made to be less than Vth1m, a drain-source voltage of the detection transistor TS1m is made to be less than Vpd1m−VGH−Vth1m, so as to enable the detection transistor TS1m to operate in a saturation status, in which case a current flowing through the reading line RLm is determined by Vpd1m, and a photocurrent signal detected by the photodiode DP1m in the first row and the m$^{th}$ column is read out to the reading line RLm; after the first reading stage t713 ends, a next first detection cycle begins to pull down the potential of the detection voltage line VG1 again to turn off the detection transistor TS1m, and to pull up the potential of the first photovoltage terminal VD1 again for resetting, and so on;

Vpd1m is the potential of the photoelectric node PD1m, and Vth1m is a threshold voltage of the detection transistor TS1m;

as for the optical detection pixel unit in the second row and the m$^{th}$ column, in the second reset stage t721, a potential of the detection voltage line VG2 is pulled down to turn off the detection transistor TS2m, a potential of the second photovoltage terminal VD2 is pulled up to the high photovoltage VDH to reset a potential of the photoelectric node PD2m, in which case the potential of the photoelectric node PD2m is equal to VDH−Vp2m, Vp2m being a turn-on voltage of the photodiode DP2m;

in the second integration stage t722, the potential of the first photovoltage terminal VD1 is pulled down to the low photovoltage VDL to make the photodiode DP1m in a reverse biased state so as to enable the photodiode DP1m to convert an optical signal received by the photodiode DP1m into a corresponding current signal, an integration process is begun, and parasitic capacitance of the gate of the detection transistor TS1m is charged with the current signal so as to change a potential of the gate of the detection transistor TS1m accordingly;

in the second reading stage t723, the potential of the detection voltage line VG2 is pulled up to the high detection voltage VGH again, in which case a gate-source voltage of the detection transistor TS2m is equal to Vpd2m−VGH, Vpd2m−VGH is made to be less than Vth2m, a drain-source voltage of the detection transistor TS2m is made to be less than Vpd2m−VGH−Vth2m, so as to enable the detection transistor TS2m to operate in a saturation status, in which case a current flowing through the reading line RLm is determined by Vpd2m, and a photocurrent signal detected by the photodiode DP2m in the second row and the m$^{th}$ column is read out to the reading line RLm;

Vpd2m is the potential of the photoelectric node PD2m, and Vth2m is a threshold voltage of the detection transistor TS2m;

and so on, as for the optical detection pixel unit in the n$^{th}$ row and the m$^{th}$ column, in the n$^{th}$ reset stage t7n1, a potential of the detection voltage line VGn is pulled down to turn off the detection transistor TSnm, a potential of the n$^{th}$ photovoltage terminal VDn is pulled up to the high photovoltage VDH to reset a potential of the photoelectric node PDnm, in which case the potential of the photoelectric node PDnm is equal to VDH−Vpnm, Vpnm being a turn-on voltage of the photodiode DPnm;

in the n$^{th}$ integration stage t7n2, the potential of the n$^{th}$ photovoltage terminal VDn is pulled down to the low photovoltage VDL to make the photodiode DPnm in a reverse biased state so as to enable the photodiode DPnm to convert an optical signal received by the photodiode DPnm into a corresponding current signal, an integration process is begun, and parasitic capacitance of the gate of the detection transistor TSnm is charged with the current signal so as to change a potential of the gate of the detection transistor TSnm accordingly;

in the n$^{th}$ reading stage t7n3, the potential of the detection voltage line VGn is pulled up to the high detection voltage VGH again, in which case a gate-source voltage of the detection transistor TSnm is equal to Vpdnm−VGH, Vpdnm−VGH is made to be less than Vthnm, a drain-source voltage of the detection transistor TSnm is made to be less than Vpdnm−VGH−Vthnm, so as to enable the detection transistor TS2m to operate in a saturation status, in which case a current flowing through the reading line RLm is determined by Vpdnm, and a photocurrent signal detected by the photodiode DPnm in the n$^{th}$ row and the m$^{th}$ column is read out to the reading line RLm; and Vpdnm is the potential of the photoelectric node PDnm, and Vthnm is a threshold voltage of the detection transistor TSnm;

According to the technical solutions of the present disclosure, in the optical detection circuit, the optical detection pixel units in each row perform active photosensitive detection in a same detection cycle corresponding to said row. In other words, since the pixel units in each column are separately connected to the corresponding sampling sub-circuits, as for any one detection cycle, every optical detection pixel unit in a row corresponding to the detection cycle will perform active photosensitive detection synchronously (parallel) in the detection cycle. Taking FIG. 7 as an example, every optical detection pixel unit in the first row will perform active photosensitive detection in the first detection cycle t71, every optical detection pixel unit in the second row will perform active photosensitive detection in the second detection cycle t72 and every optical detection pixel unit in the n$^{th}$ row will perform active photosensitive detection in the n$^{th}$ detection cycle t7n.

According to some embodiments of the present disclosure, as for the a$^{th}$ reading stage included in the a$^{th}$ detection cycle corresponding to the optical detection pixel units in the a$^{th}$ row, and the b$^{th}$ reading stage included in the b$^{th}$ detection cycle corresponding to the optical detection pixel units in the b$^{th}$ row, the a$^{th}$ reading stage and the b$^{th}$ reading stage do not overlap with each other, both a and b are positive integers, but a is not equal to b.

Figure 8:
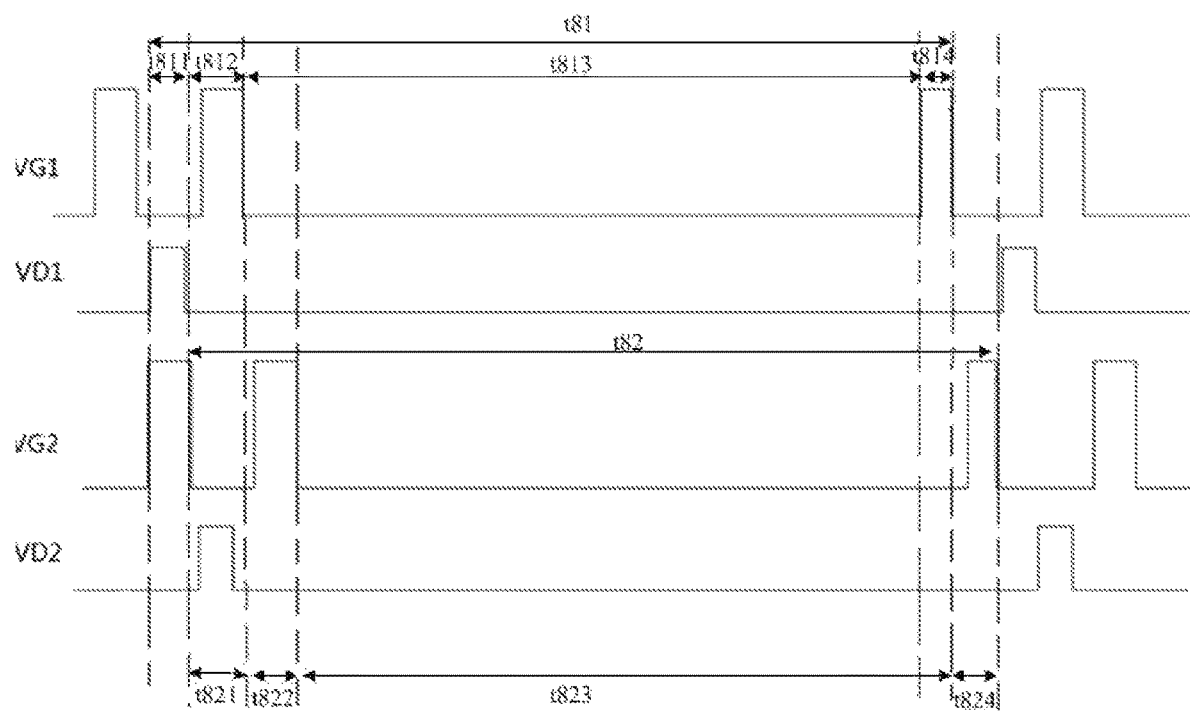
FIG. 8 is a second working sequence diagram of the optical detection pixel units in the $m^{th}$ column shown in FIG. 6.

In practical application, a difference in the turn-on voltage Vp of the photodiode caused by PIN processes will lead to a difference in the reset potential VDH−Vp of the cathode of the photodiode, therefore, the time sequence shown in FIG. 8 is adopted to obviate the effect of the difference in the turn-on voltage Vp on the detected optical signal.

As shown in FIG. 8, when the optical detection pixel units in the m$^{th}$ column and the m$^{th}$ sampling module Cm connected thereto, which are included in the optical detection circuit as shown in FIG. 6, operates, the optical detection pixel unit in the first row and the m$^{th}$ column is corresponding to a first detection cycle t81; and the optical detection pixel unit in the second row and the m$^{th}$ column is corresponding to a second detection cycle t82;

the first detection cycle t81 includes a first reset stage t811, a first reading stage t812 of the first row, a first integration stage t813 and a second reading stage t814 of the first row, which are sequentially arranged;

the second detection cycle t82 includes a second reset stage t821, a first reading stage t822 of the second row, a second integration stage t823 and a second reading stage t824 of the second row, which are sequentially arranged;

in the first reset stage t811, a high photovoltage VDH is provided for the first photovoltage terminal VD1 to turn on the photodiode DP1m, so as to reset a potential of the gate of the detection transistor TS1m to a reset voltage of the first row and the m$^{th}$ column, which is equal to VDH−Vp1m; Vp1m is a turn-on voltage of the photodiode DP1m;

in the first reading stage t812 of the first row, a high detection voltage VGH is provided for the detection voltage line VG1, in which case a gate-source voltage of the detection transistor TS1m is equal to Vpd1m−VGH, Vpd1m−VGH is made to be less than Vth1m, a drain-source voltage of the detection transistor TS1m is made to be less than Vpd1m−VGH−Vth1m, so as to enable the detection transistor TS1m to operate in a saturation status, in which case a current flowing through the reading line RLm is determined by Vpd1m, and a first photocurrent of the first row detected by the photodiode DP1m in the first row and the m$^{th}$ column is read out to the reading line RLm; the first photocurrent of the first row is corresponding to the reset voltage of the first row and the m$^{th}$ column; Vpd1m is a potential of the photoelectric node PD1m, and Vth1m is a threshold voltage of the photodiode DP1m;

in the first integration stage t813, a low detection voltage VGL is provided for the detection voltage line VG1 to turn off the detection transistor TS1m, and a low photovoltage VDL is provided for the first photovoltage terminal VD1, so as to reverse bias the photodiode DP1m to convert an optical signal received by the photodiode DP1m into a corresponding current signal, which is used to charge parasitic capacitance of the gate of the detection transistor TS1m, so as to change the potential of the gate of the detection transistor TS1m accordingly;

in the second reading stage t814 of the first row, the high detection voltage VGH is provided for the detection voltage line VG1, so as to control the detection transistor TS1m to operate in a saturation status to make the reading line RLm output a second photocurrent of the first row, which is corresponding to the potential of the gate of the detection transistor TS1m in the second reading stage of the first row; the optical signal detected by the photodiode DP1m may be calculated on the basis of a difference between the second photocurrent of the first row and the first photocurrent of the first row, and the effect of the difference in Vp1m is obviated;

in the second reset stage t821, the high photovoltage VDH is provided for the second photovoltage terminal VD2 to turn on the photodiode DP2m, so as to reset a potential of the gate of the detection transistor TS2m to a reset voltage of the second row and the m$^{th}$ column, which is equal to VDH−Vp2m; Vp2m is a turn-on voltage of the photodiode DP2m;

in the first reading stage t822 of the second row, the high detection voltage VGH is provided for the detection voltage line VG2, in which case a gate-source voltage of the detection transistor TS2m is equal to Vpd2m−VGH, Vpd2m−VGH is made to be less than Vth2m, a drain-source voltage of the detection transistor TS2m is made to be less than Vpd2m−VGH−Vth2m, so as to enable the detection transistor TS2m to operate in a saturation status, in which case a current flowing through the reading line RLm is determined by Vpd2m, and a first photocurrent of the second row detected by the photodiode DP2m in the second row and the m$^{th}$ column is read out to the reading line RLm; the first photocurrent of the second row is corresponding to the reset voltage of the second row and the m$^{th}$ column; Vpd2m is a potential of the photoelectric node PD2m, and Vth2m is a threshold voltage of the photodiode DP2m;

in the second integration stage t823, the low detection voltage VGL is provided for the detection voltage line VG2 to turn off the detection transistor TS2m, and the low photovoltage VDL is provided for the second photovoltage terminal VD2, so as to reverse bias the photodiode DP2m to convert an optical signal received by the photodiode DP2m into a corresponding current signal, which is used to charge parasitic capacitance of the gate of the detection transistor TS2m, so as to change the potential of the gate of the detection transistor TS2m accordingly; and in the second reading stage t824 of the second row, the high detection voltage VGH is provided for the detection voltage line VG2, so as to control the detection transistor TS2m to operate in a saturation status to make the reading line RLm output a second photocurrent of the second row, which is corresponding to the potential of the gate of the detection transistor TS2m in the second reading stage of the second row; the optical signal detected by the photodiode DP2m may be calculated on the basis of a difference between the second photocurrent of the second row and the first photocurrent of the second row, and the effect of the difference in Vp2m is obviated;

According to some embodiments of the present disclosure, the a$^{th}$ detection cycle is corresponding to the optical detection pixel units in the a$^{th}$ row, and the b$^{th}$ detection cycle is corresponding to the optical detection pixel units in the b$^{th}$ row, a first reading stage of the a$^{th}$ row included in the a$^{th}$ detection cycle and a first reading stage of the b$^{th}$ row included in the b$^{th}$ detection cycle do not overlap with each other, a second reading stage of the a$^{th}$ row included in the a$^{th}$ detection cycle and a second reading stage of the b$^{th}$ row included in the b$^{th}$ detection cycle do not overlap with each other, the first reading stage of the a$^{th}$ row included in the a$^{th}$ detection cycle and the second reading stage of the b$^{th}$ row included in the b$^{th}$ detection cycle do not overlap with each other, the second reading stage of the a$^{th}$ row included in the a$^{th}$ detection cycle and the first reading stage of the b$^{th}$ row included in the b$^{th}$ detection cycle do not overlap with each other, both a and b are positive integers, but a is not equal to b.

An optical detection method according to the embodiments of the present disclosure is applied to the aforesaid optical detection circuit, and the optical detection pixel units in the n$^{th}$ row included in the optical detection circuit is corresponding to an n$^{th}$ detection cycle; the n$^{th}$ detection cycle includes an n$^{th}$ reset stage, an n$^{th}$ integration stage and an n$^{th}$ reading stage, which are sequentially arranged; and the optical detection method includes: in the n$^{th}$ detection cycle, in the n$^{th}$ reset stage, resetting a potential of the gate of the detection transistor in the n$^{th}$ row and the m$^{th}$ column;

in the n$^{th}$ integration stage, providing a first detection voltage for the detection voltage line in the n$^{th}$ row to turn off the detection transistor in the n$^{th}$ row and the m$^{th}$ column, providing a first photovoltage for the n$^{th}$ photovoltage terminal, so as to reverse bias the photodiode in the n$^{th}$ row and the m$^{th}$ column to convert an optical signal received by the photodiode in the n$^{th}$ row and the m$^{th}$ column into a corresponding current signal, and charging parasitic capacitance of the gate of the detection transistor in the n$^{th}$ row and the m$^{th}$ column with the current signal, so as to change the potential of the gate of the detection transistor in the n$^{th}$ row and the m$^{th}$ column accordingly;

in the n$^{th}$ reading stage, providing a second detection voltage for the detection voltage line in the n$^{th}$ row to control the detection transistor in the n$^{th}$ row and the m$^{th}$ column to operate in a saturation status, so as to make the reading line in the m$^{th}$ column output a photocurrent, the photocurrent being corresponding to the potential of the gate of the detection transistor in the n$^{th}$ row and the m$^{th}$ column in the n$^{th}$ reading stage;

the reading stages each included in a detection cycle corresponding to a row of optical detection pixel units included in the optical detection circuit do not overlap with each other; and n is a positive integer less than or equal to N, m is a positive integer less than or equal to M, and both N and M are positive integers.

Specifically, the photosensitive element in the $n^{th}$ row and the $m^{th}$ column may be a photodiode in the $n^{th}$ row and the $m^{th}$ column; an anode of the photodiode in the $n^{th}$ row and the $m^{th}$ column is the first electrode of the photosensitive element in the $n^{th}$ row and the $m^{th}$ column, and a cathode of the photodiode in the $n^{th}$ row and the $m^{th}$ column is the second electrode of the photosensitive element in the $n^{th}$ row and the $m^{th}$ column; and the optical detection method may further include:

in the $n^{th}$ reset stage, providing a second photovoltage for the $n^{th}$ photovoltage terminal to turn on the photodiode in the $n^{th}$ row and the $m^{th}$ column so as to reset the potential of the gate of the detection transistor in the $n^{th}$ row and the $m^{th}$ column; and in the $n^{th}$ integration stage, controlling to reverse bias the photodiode in the $n^{th}$ row and the $m^{th}$ column, so as to enable the photodiode in the $n^{th}$ row and the $m^{th}$ column to detect the optical signal.

Specifically, the optical detection circuit may include sampling sub-circuits; and the optical detection method may further include:

in the $n^{th}$ reading stage, sampling a photocurrent output by the reading line in the $m^{th}$ column with the sampling sub-circuit, and obtaining the optical signal detected by the photodiode in the $n^{th}$ row and the $m^{th}$ column according to the photocurrent output by the reading line in the $m^{th}$ column.

An optical detection method according to the embodiments of the present disclosure is applied to the aforesaid optical detection circuit, and the photosensitive element in the $n^{th}$ row and the $m^{th}$ column is a photodiode in the $n^{th}$ row and the $m^{th}$ column; an anode of the photodiode in the $n^{th}$ row and the $m^{th}$ column is the first electrode of the photosensitive element in the $n^{th}$ row and the $m^{th}$ column, and a cathode of the photodiode in the $n^{th}$ row and the $m^{th}$ column is the second electrode of the photosensitive element in the $n^{th}$ row and the $m^{th}$ column; and the optical detection pixel units in the $n^{th}$ row included in the optical detection circuit is corresponding to an $n^{th}$ detection cycle; the $n^{th}$ detection cycle includes an $n^{th}$ reset stage, a first reading stage of the $n^{th}$ row, an $n^{th}$ integration stage and a second reading stage of the $n^{th}$ row, which are sequentially arranged; and the optical detection method includes: in the $n^{th}$ detection cycle, in the $n^{th}$ reset stage, providing a second photovoltage for the $n^{th}$ photovoltage terminal to turn on the photodiode in the $n^{th}$ row and the $m^{th}$ column so as to reset a potential of the gate of the detection transistor in the $n^{th}$ row and the $m^{th}$ column to a reset voltage of the $n^{th}$ row and the $m^{th}$ column, which is equal to VDH−Vpnm;

in the first reading stage of the $n^{th}$ row, providing a second detection voltage for the detection voltage line in the $n^{th}$ row to control the detection transistor in the $n^{th}$ row and the $m^{th}$ column to operate in a saturation status, so as to make the reading line in the $m^{th}$ column output a first photocurrent, the first photocurrent being corresponding to the reset voltage of the $n^{th}$ row and the $m^{th}$ column;

in the $n^{th}$ integration stage, providing a first detection voltage for the detection voltage line in the $n^{th}$ row to turn off the detection transistor in the $n^{th}$ row and the $m^{th}$ column, providing a first photovoltage for the $n^{th}$ photovoltage terminal, so as to reverse bias the photodiode in the $n^{th}$ row and the $m^{th}$ column to convert an optical signal received by the photodiode in the $n^{th}$ row and the $m^{th}$ column into a corresponding current signal, and charging parasitic capacitance of the gate of the detection transistor in the $n^{th}$ row and the $m^{th}$ column with the current signal, so as to change the potential of the gate of the detection transistor in the $n^{th}$ row and the $m^{th}$ column accordingly;

in the second reading stage of the $n^{th}$ row, providing the second detection voltage for the detection voltage line in the $n^{th}$ row to control the detection transistor in the $n^{th}$ row and the $m^{th}$ column to operate in a saturation status, so as to make the reading line in the $m^{th}$ column output a second photocurrent, the second photocurrent being corresponding to the potential of the gate of the detection transistor in the $n^{th}$ row and the $m^{th}$ column in the second reading stage of the $n^{th}$ row;

Vpnm is a turn-on voltage of the photodiode in the $n^{th}$ row and the $m^{th}$ column;

the first reading stages each included in a detection cycle corresponding to a row of optical detection pixel units included in the optical detection circuit do not overlap with each other; the second reading stages each included in a detection cycle corresponding to a row of optical detection pixel units included in the optical detection circuit do not overlap with each other; the first reading stages each included in a detection cycle corresponding to a row of optical detection pixel units included in the optical detection circuit, and the second reading stages each included in a detection cycle corresponding to a row of optical detection pixel units included in the optical detection circuit do not overlap with each other; and the second reading stages each included in a detection cycle corresponding to a row of optical detection pixel units included in the optical detection circuit, and the first reading stages each included in a detection cycle corresponding to a row of optical detection pixel units included in the optical detection circuit do not overlap with each other; and n is a positive integer less than or equal to N, m is a positive integer less than or equal to M, and both N and M are positive integers.

Specifically, the optical detection circuit may further include sampling sub-circuits; the optical detection method may further include:

in the first reading stage of the $n^{th}$ row, sampling by a corresponding sampling sub-circuit a first photocurrent output on the reading line in the $m^{th}$ column;

in the second reading stage of the $n^{th}$ row, sampling by a corresponding sampling sub-circuit a second photocurrent output on the reading line in the $m^{th}$ column;

and obtaining the optical signal detected by the photodiode in the $n^{th}$ row and the $m^{th}$ column on the basis of a difference between the second photocurrent and the first photocurrent.

A display device according to the embodiments of the present disclosure includes the aforesaid optical detection circuit.

The display device according to the embodiments of the present disclosure may be any product or component having a display function, such as a mobile phone, a tablet computer, a TV, a monitor, a laptop computer, a digital photo frame and a navigator.

The above is preferred embodiments of the present disclosure. It should be noted that those of ordinary skill in the art may make various improvements and modifications without departing from the principle of the present disclosure, and these improvements and modifications shall be considered to fall into the protection scope of the present disclosure.

What is claimed is:

1. An optical detection method for an optical detection pixel unit, the optical detection pixel unit consisting of a photosensitive element and a detection transistor, wherein the photosensitive element has a first electrode connected with a photovoltage terminal, and a second electrode connected with a gate of the detection transistor; and the detection transistor has a first electrode connected with a detection voltage line, and a second electrode connected with a reading line;

wherein the photosensitive element is a photodiode; and an anode of the photodiode is the first electrode of the photosensitive element, and a cathode of the photodiode is the second electrode of the photosensitive element, the method comprising a reset stage, an integration stage and a reading stage sequentially in each detection cycle, wherein:

in the reset stage, resetting a potential of the gate of the detection transistor;

in the integration stage, providing a first detection voltage for the detection voltage line to turn off the detection transistor, and providing a first photovoltage for the photovoltage terminal so as to enable the photosensitive element to convert an optical signal received by the photosensitive element into a corresponding current signal; and in the reading stage, providing a second detection voltage for the detection voltage line to control the detection transistor to operate in a saturation status.

2. The optical detection method according to claim 1, wherein in the reset stage a second photovoltage is provided for the photovoltage terminal to turn on the photodiode; and in the integration stage the first photovoltage is provided for the photovoltage terminal to reverse bias the photodiode.

3. The optical detection method according to claim 2, wherein the first photovoltage is lower than the second photovoltage, and the first detection voltage is lower than the second detection voltage.

4. An optical detection method for the optical detection pixel unit according to claim 1, wherein the optical detection method comprises a reset stage, a first reading stage, an integration stage and a second reading stage sequentially in each detection cycle, wherein in the reset stage, providing a second photovoltage for the photovoltage terminal to turn on the photodiode;

in the first reading stage, providing a second detection voltage for the detection voltage line to control the detection transistor to operate in a saturation status;

in the integration stage, providing a first detection voltage for the detection voltage line to turn off the detection transistor, and providing a first photovoltage for the photovoltage terminal to reverse bias the photodiode; and in the second reading stage, providing the second detection voltage for the detection voltage line to control the detection transistor to operate in a saturation status;

wherein the first photovoltage is lower than the second photovoltage, and the first detection voltage is lower than the second detection voltage.

5. An optical detection method for an optical detection circuit, wherein the optical detection circuit comprises N rows of detection voltage lines, M columns of reading lines, and optical detection pixel units arranged in N rows and M columns;

the optical detection pixel unit in the $n^{th}$ row and the $m^{th}$ column consists of a photosensitive element in the $n^{th}$ row and the $m^{th}$ column and a detection transistor in the $n^{th}$ row and the $m^{th}$ column, wherein the photosensitive element in the $n^{th}$ row and the $m^{th}$ column has a first electrode connected with an $n^{th}$ photovoltage terminal, and a second electrode connected with a gate of the detection transistor in the $n^{th}$ row and the $m^{th}$ column; the detection transistor in the $n^{th}$ row and the $m^{th}$ column has a first electrode connected with a detection voltage line in the $n^{th}$ row, and a second electrode connected with a reading line in the $m^{th}$ column;

an $m^{th}$ current source is connected with the reading line in the $m^{th}$ column for providing an $m^{th}$ constant current for the reading line in the $m^{th}$ column; and both N and M are positive integers, n is a positive integer less than or equal to N, and m is a positive integer less than or equal to M;

wherein the optical detection method drives all rows of the optical detection pixel units in the optical detection circuit to perform optical detection one row by one row, and provides an $n^{th}$ detection cycle for the optical detection pixel units in the $n^{th}$ row; the $n^{th}$ detection cycle includes an $n^{th}$ reset stage, an $n^{th}$ integration stage and an $n^{th}$ reading stage, which are sequentially arranged; wherein, in the $n^{th}$ reset stage, resetting a potential of the gate of the detection transistor in the $n^{th}$ row and the $m^{th}$ column;

in the $n^{th}$ integration stage, providing a first detection voltage for the detection voltage line in the $n^{th}$ row to turn off the detection transistor in the $n^{th}$ row and the $m^{th}$ column, and providing a first photovoltage for the $n^{th}$ photovoltage terminal, so as to reverse bias the photosensitive element in the $n^{th}$ row and the $m^{th}$ column;

in the $n^{th}$ reading stage, providing a second detection voltage for the detection voltage line in the $n^{th}$ row to control the detection transistor in the $n^{th}$ row and the $m^{th}$ column to operate in a saturation status; and the reading stages each included in a detection cycle corresponding to a row of optical detection pixel units in the optical detection circuit do not overlap with each other.

6. The optical detection method according to claim 5, wherein the photosensitive element in the $n^{th}$ row and the $m^{th}$ column is a photodiode in the $n^{th}$ row and the $m^{th}$ column; an anode of the photodiode in the $n^{th}$ row and the $m^{th}$ column is the first electrode of the photosensitive element in the $n^{th}$ row and the $m^{th}$ column, and a cathode of the photodiode in the $n^{th}$ row and the $m^{th}$ column is the second electrode of the photosensitive element in the $n^{th}$ row and the $m^{th}$ column; and the optical detection method further comprises:

in the $n^{th}$ reset stage, providing a second photovoltage for the $n^{th}$ photovoltage terminal to turn on the photodiode in the $n^{th}$ row and the $m^{th}$ column; and in the $n^{th}$ integration stage, controlling to reverse bias the photodiode in the $n^{th}$ row and the $m^{th}$ column.

7. The optical detection method according to claim 6, wherein the first photovoltage is lower than the second photovoltage, and the first detection voltage is lower than the second detection voltage.

8. The optical detection method according to claim 6, wherein the optical detection circuit further comprises sampling sub-circuits; and the optical detection method further comprises:

in the $n^{th}$ reading stage, sampling by a corresponding sampling sub-circuit a photocurrent output on the reading line in the $m^{th}$ column.

9. The optical detection method according to claim 5, wherein the optical detection circuit further comprises sampling sub-circuits; and the sampling sub-circuits are separately connected to the M columns of reading lines for collecting photocurrent therefrom.

10. The optical detection method according to claim 9, wherein the sampling sub-circuit comprises M sampling modules, each sampling module being corresponding to one column of the M columns of the reading lines;

the sampling module comprises an operational transconductance amplifier, a resistor module and a digital-to-analog converter; and the operational transconductance amplifier has an inverting input terminal connected with the reading line, a positive input terminal connected with a reference voltage, and an output terminal connected to an input terminal of the digital-to-analog converter via the resistor module.

11. An optical detection method for an optical detection circuit, comprising N rows of detection voltage lines, M columns of reading lines, and optical detection pixel units arranged in N rows and M columns:

the optical detection pixel unit in the $n^{th}$ row and the $m^{th}$ column consists of a photosensitive element in the $n^{th}$ row and the $m^{th}$ column and a detection transistor in the $n^{th}$ row and the $m^{th}$ column, wherein the photosensitive element in the $n^{th}$ row and the $m^{th}$ column has a first electrode connected with an $n^{th}$ photovoltage terminal, and a second electrode connected with a gate of the detection transistor in the $n^{th}$ row and the $m^{th}$ column; the detection transistor in the $n^{th}$ row and the $m^{th}$ column has a first electrode connected with a detection voltage line in the $n^{th}$ row, and a second electrode connected with a reading line in the $m^{th}$ column;

an $m^{th}$ current source is connected with the reading line in the $m^{th}$ column for providing an $m^{th}$ constant current for the reading line in the $m^{th}$ column; and both N and M are positive integers, n is a positive integer less than or equal to N, and m is a positive integer less than or equal to M, wherein the photosensitive element in the $n^{th}$ row and the $m^{th}$ column is a photodiode in the $n^{th}$ row and the $m^{th}$ column; an anode of the photodiode in the $n^{th}$ row and the $m^{th}$ column is the first electrode of the photosensitive element in the $n^{th}$ row and the $m^{th}$ column, and a cathode of the photodiode in the $n^{th}$ row and the $m^{th}$ column is the second electrode of the photosensitive element in the $n^{th}$ row and the $m^{th}$ column; and the optical detection pixel units in the $n^{th}$ row in the optical detection circuit is corresponding to an $n^{th}$ detection cycle; the $n^{th}$ detection cycle includes an $n^{th}$ reset stage, a first reading stage of the $n^{th}$ row, an $n^{th}$ integration stage and a second reading stage of the $n^{th}$ row, which are sequentially arranged; and the optical detection method comprises: in the $n^{th}$ detection cycle, in the $n^{th}$ reset stage, providing a second photovoltage for the $n^{th}$ photovoltage terminal to turn on the photodiode in the $n^{th}$ row and the $m^{th}$ column;

in the first reading stage of the $n^{th}$ row, providing a second detection voltage for the detection voltage line in the $n^{th}$ row to control the detection transistor in the $n^{th}$ row and the $m^{th}$ column to operate in a saturation status;

in the $n^{th}$ integration stage, providing a first detection voltage for the detection voltage line in the $n^{th}$ row to turn off the detection transistor in the $n^{th}$ row and the $m^{th}$ column, and providing a first photovoltage for the $n^{th}$ photovoltage terminal, so as to reverse bias the photodiode in the $n^{th}$ row and the $m^{th}$ column;

in the second reading stage of the $n^{th}$ row, providing the second detection voltage for the detection voltage line in the $n^{th}$ row to control the detection transistor in the $n^{th}$ row and the $m^{th}$ column to operate in a saturation status; and the first reading stages each included in a detection cycle corresponding to a row of optical detection pixel units in the optical detection circuit do not overlap with each other; the second reading stages each included in a detection cycle corresponding to a row of optical detection pixel units in the optical detection circuit do not overlap with each other; the first reading stages each included in a detection cycle corresponding to a row of optical detection pixel units in the optical detection circuit, and the second reading stages each included in a detection cycle corresponding to a row of optical detection pixel units in the optical detection circuit do not overlap with each other; and the second reading stages each included in a detection cycle corresponding to a row of optical detection pixel units in the optical detection circuit, and the first reading stages each included in a detection cycle corresponding to a row of optical detection pixel units in the optical detection circuit do not overlap with each other; wherein the first photovoltage is lower than the second photovoltage, and the first detection voltage is lower than the second detection voltage.

12. The optical detection method according to claim 11, wherein the optical detection circuit further comprises sampling sub-circuits; and the optical detection method further comprises:

in the first reading stage of the $n^{th}$ row, sampling by a corresponding sampling sub-circuit a first photocurrent output on the reading line in the $m^{th}$ column;

in the second reading stage of the $n^{th}$ row, sampling by a corresponding sampling sub-circuit a second photocurrent output on the reading line in the $m^{th}$ column; and obtaining the optical signal detected by the photodiode in the $n^{th}$ row and the $m^{th}$ column on the basis of a difference between the second photocurrent and the first photocurrent.

* * * * *